(12) United States Patent
Lee et al.

(10) Patent No.: US 9,755,457 B2
(45) Date of Patent: Sep. 5, 2017

(54) UNINTERRUPTIBLE POWER SUPPLY APPARATUS

(71) Applicant: Toshiba Mitsubishi-Electric Industrial Systems Corporation, Chuo-ku (JP)

(72) Inventors: Tingan Lee, Chuo-ku (JP); Masaru Toyoda, Chuo-ku (JP); Hiroshi Masunaga, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 225 days.

(21) Appl. No.: 14/805,846

(22) Filed: Jul. 22, 2015

(65) Prior Publication Data

US 2016/0226301 A1 Aug. 4, 2016

(30) Foreign Application Priority Data

Feb. 4, 2015 (JP) ................. 2015-019916

(51) Int. Cl.
*H02M 7/42* (2006.01)
*H02J 9/06* (2006.01)
*H02J 7/00* (2006.01)
*H02M 7/02* (2006.01)
*H05K 7/20* (2006.01)

(52) U.S. Cl.
CPC ............ *H02J 9/061* (2013.01); *H02J 7/0068* (2013.01); *H02M 7/02* (2013.01); *H02M 7/42* (2013.01); *H05K 7/20863* (2013.01); *H05K 7/20945* (2013.01)

(58) Field of Classification Search
CPC .. H02M 7/42; H05K 7/20863; H05K 7/20945
USPC ........................................................ 307/65
See application file for complete search history.

(56) References Cited

FOREIGN PATENT DOCUMENTS

JP 2006-66453 3/2006

*Primary Examiner* — Robert Deberadinis
(74) *Attorney, Agent, or Firm* — Oblon, McClelland, Maier & Neustadt, L.L.P.

(57) ABSTRACT

Provided is an uninterruptible power supply apparatus that can properly adjust the capacity of cooling a heat radiation source. A housing for housing an uninterruptible power module is provided with a cooling fan for cooling the internal space of the housing. The housing is further formed with an opening. The opening formed in one housing and the opening formed in an adjacent housing for housing another uninterruptible power module are configured to face each other. Furthermore, each uninterruptible power module includes a fan control circuit for controlling the cooling fan. The fan control circuit controls the actuation and suspension of the cooling fan on the basis of a total load of the plurality of uninterruptible power modules.

5 Claims, 7 Drawing Sheets

FIG.8

| MALFUNCTIONED FANS \ REQUIRED FANS | 1 | 2 | 3 | 4 |
|---|---|---|---|---|
| 0 | 1 | 2 | 3 | 4 |
| 1 | 1 | 2 | 3 | BYPASS |
| 2 | 1 | 2 | BYPASS | BYPASS |
| 3 | 1 | BYPASS | BYPASS | BYPASS |
| 4 | BYPASS | BYPASS | BYPASS | BYPASS |

UNINTERRUPTIBLE POWER SUPPLY APPARATUS

BACKGROUND OF THE INVENTION

Field of the Invention

The present invention relates to an uninterruptible power supply apparatus, and in particular relates to an uninterruptible power supply apparatus provided with a plurality of uninterruptible power modules each having a cooling fan.

Description of the Background Art

Conventionally, there has been proposed such an electronic apparatus that is disposed with a plurality of units inside a shelf, and each unit includes an air inlet formed on a first surface, an air outlet formed on a second surface facing the first surface, a cooling fan for taking in cooling air through the air inlet and discharging it from the air outlet, and an opening formed on a third surface different from both the first surface and the second surface for communicating an internal space of the unit and an internal space of the shelf (for example, see Japanese Patent Laying-Open No. 2006-66453).

SUMMARY OF THE INVENTION

An uninterruptible power supply apparatus is used as a power-supplying device for supplying stable power to an important load such as a computer system. The uninterruptible power supply apparatus includes various electrical components such as a converter for converting commercial AC power into DC power and an inverter for converting the DC power converted by the converter or the DC power provided by a power storage device into AC power and supplying it to a load. The electrical components are accommodated in a housing. A cooling fan is provided to generate a cooling air current inside the housing, and the electrical components are cooled down by radiating heat to the cooling air.

In the case where the uninterruptible power supply apparatus is under a low load and however all the cooling fans are actuated at the rated load, the cooling capacity becomes excessively large relative to the amount of heat generated by the electrical components, which thereby increases the operation cost and the operation noise disadvantageously.

The present invention has been made in view of the above problems, and a major object of the present invention is to provide an uninterruptible power supply apparatus that can properly adjust the capacity of cooling a heat radiation source.

The uninterruptible power supply apparatus according to the present invention is provided with a plurality of uninterruptible power modules connected in parallel between an AC power source and a load, and a bypass circuit. Each uninterruptible power module includes a converter for converting AC power supplied from the AC power source into DC power, a power storage device for storing the DC power converted by the converter, an inverter for converting DC power supplied from the converter or the power storage device into AC power, a housing for housing the converter and the inverter, and a cooling fan for cooling the interior of the housing. The housing is formed with an opening. The opening and an opening formed in an adjacent housing for housing another uninterruptible power module are configured to face each other. Each uninterruptible power module further includes a fan control circuit for controlling the cooling fan. The fan control circuit controls the actuation and suspension of the cooling fans on the basis of a total load of the plurality of uninterruptible power modules.

Preferably, the fan control circuit detects a malfunctioned cooling fan of the cooling fans, and the fan control circuit controls the actuation and suspension of the cooling fans on the basis of the malfunctioned number of the cooling fans and the total load of the plurality of uninterruptible power modules.

Preferably, the uninterruptible power supply apparatus switches to a bypass circuit when the number of the cooling fans required to be actuated, which is determined on the basis of the total load of the plurality of uninterruptible power modules, exceeds the number of the cooling fans operating normally.

Preferably, the uninterruptible power supply apparatus issues an alarm and continues the operation when the number of the cooling fans required to be actuated, which is determined on the basis of the total load of the plurality of uninterruptible power modules, is equal to or less than the number of the cooling fans operating normally.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a table illustrating the relationship of the number of operating cooling fans to the required number of cooling fans and the malfunctioned number of cooling fans.

DESCRIPTION OF THE PREFERRED EMBODIMENTS

Figure 1:
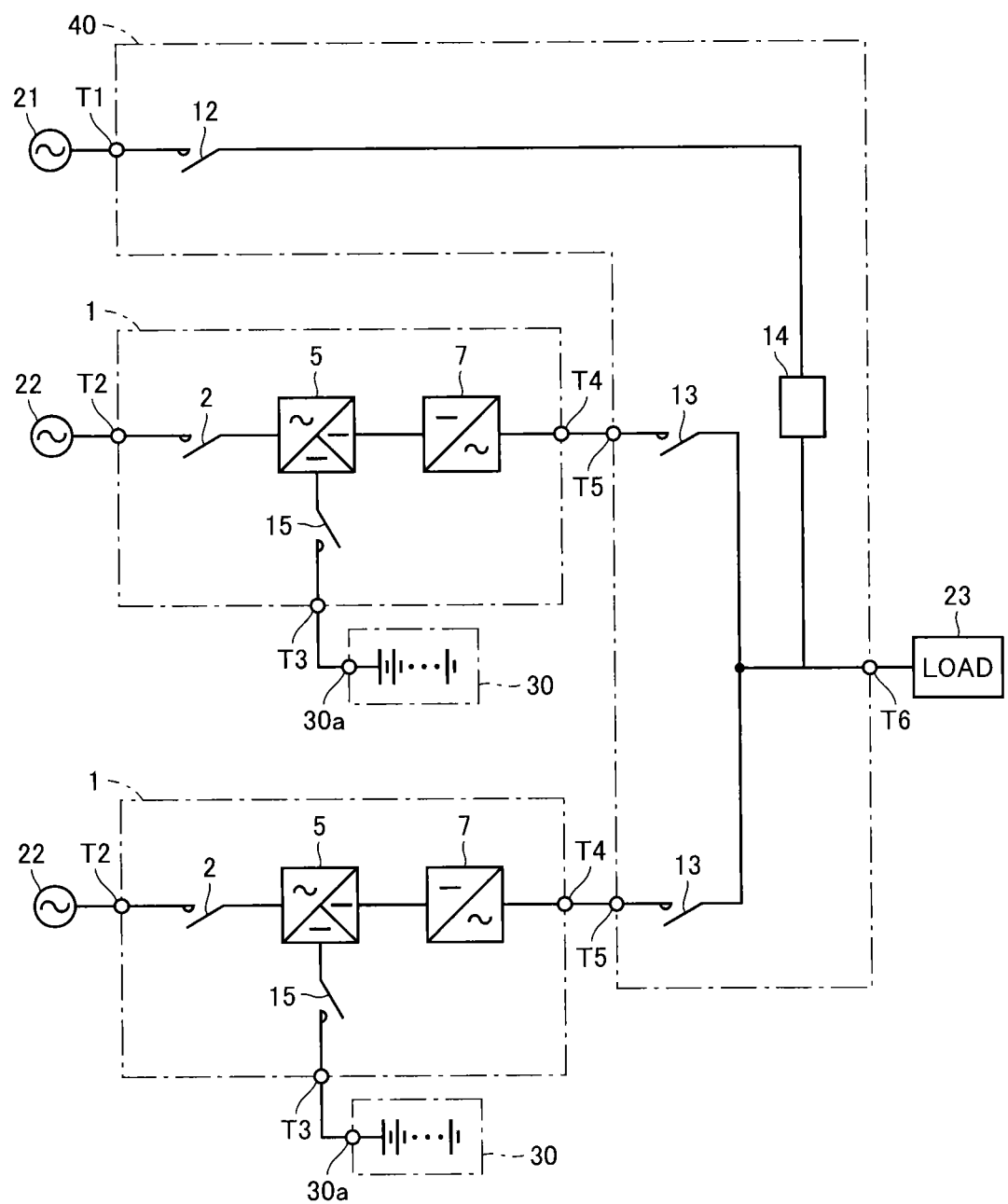
FIG. 1 is a circuit block diagram illustrating a configuration of an uninterruptible power supply apparatus according to an embodiment of the present invention.

Hereinafter, embodiments of the present invention will be described with reference to the accompanying drawings. The same or corresponding parts will be denoted by the same reference numerals in the following drawings and the description thereof will not be repeated.

FIG. 1 is a circuit block diagram illustrating a configuration of an uninterruptible power supply apparatus according to an embodiment of the present invention. As illustrated in FIG. 1, the uninterruptible power supply apparatus is provided with a plurality of uninterruptible power modules 1 and a bypass circuit 40.

Each uninterruptible power module 1 includes an AC input terminal T2, a battery terminal T3, and an output terminal T4. AC input terminal T2 receives AC power from an AC power source 22. AC power source 22 may be a commercial AC power source, a household power generator or the like. The AC power may have three phases or a single phase. Battery terminal T3 is connected to a positive electrode 30a of battery 30 which serves as a power storage device.

Uninterruptible power module 1 further includes a switch 2, a converter 5, an inverter 7, and a switch 15. Switch 2, converter 5 and inverter 7 are sequentially connected in series between AC input terminal T2 and output terminal T4. Switch 15 is connected between an output terminal of converter 5 and battery terminal T3.

Bypass circuit 40 includes a bypass input terminal T1, an input terminal T5, and an output terminal T6. Bypass input terminal T1 receives AC power from an AC power source 21. Input terminal T5 is connected to output terminal T4 of uninterruptible power module 1. Output terminal T6 is connected by a load 23.

Bypass circuit 40 further includes a switch 12, switches 13, and a static transfer switch 14. Switch 12 is connected between bypass input terminal T1 and static transfer switch 14. Switch 13 is connected between input terminal T5 and output terminal T6. Switches 13 and 13 are connected in parallel with each other.

One terminal of switch 12 is electrically connected to AC power source 21 via bypass input terminal T1. The other terminal of switch 12 is electrically connected to static transfer switch 14. One terminal of switch 13 is electrically connected to output terminal T4 of uninterruptible power module 1 via input terminal T5 of bypass circuit 40. The other terminal of switch 13 is electrically connected to load 23 via output terminal T6 of bypass circuit 40. Static transfer switch 14 is electrically connected to load 23 via output terminal T6 of bypass circuit 40.

The plurality of uninterruptible power modules 1 are connected in parallel between AC power source 22 and load 23.

Each uninterruptible power supply apparatus is configured to operate at an inverter power-supplying mode where the AC power converted by inverter 7 is supplied to load 23 or at a bypass power-supplying mode where the AC power received from AC power source 21 is supplied to load 23.

In the inverter power-supplying mode, converter 5 receives AC power from AC power source 22, converts the AC power into DC power, and supplies the DC power to inverter 7 and battery 30. Battery 30 functions as a power storage device to store the DC power converted by converter 5. Inverter 7 converts the DC power received from converter 5 to AC power and outputs the AC power. The AC power output from inverter 7 is supplied to load 23.

In the case where AC power source 22 is out of power and thus fails to supply AC power, the operation of converter 5 is stopped, and battery 30 supplies DC power to inverter 7. Inverter 7 converts the DC power received from battery 30 to AC power and outputs the AC power. The AC power output from inverter 7 is supplied to load 23.

In the inverter power-supplying mode, switch 2 and switch 15 provided in uninterruptible power module 1 and switch 13 provided in bypass circuit 40 are conductive.

At the time where uninterruptible power module 1 is under maintenance, inspection or replacement, the uninterruptible power supply apparatus operates at the bypass power-supplying mode. In the bypass power-supplying mode, switch 2 and switch 13 are nonconductive while switch 12 of bypass circuit 40 is conductive, and thus the AC power is supplied to load 23 from AC power source 21.

In the case where converter 5 or inverter 7 malfunctions in the inverter power-supplying mode, the uninterruptible power supply apparatus switches from the inverter power-supplying mode to the bypass power-supplying mode. In the case where converter 5 or inverter 7 malfunctions in the inverter power-supplying mode, static transfer switch 14 instantaneously supplies the AC power received from AC power source 21 to load 23.

Figure 2:
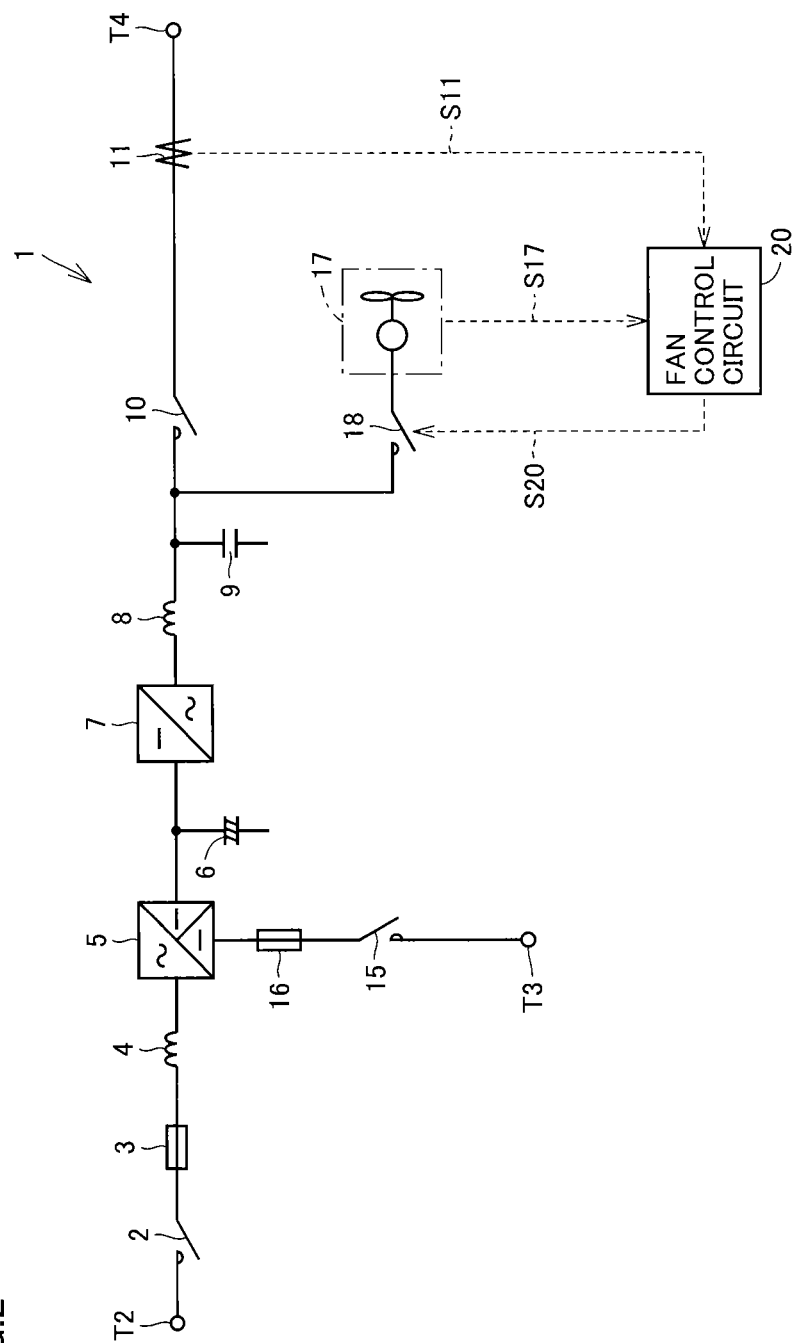
FIG. 2 is a block diagram illustrating the configuration of an uninterruptible power module illustrated in FIG. 1.

FIG. 2 is a block diagram illustrating the configuration of uninterruptible power module 1 illustrated in FIG. 1. FIG. 2 illustrates the configuration of uninterruptible power module 1 in more detail.

As illustrated in FIG. 2, uninterruptible power module 1 is provided with switches 2, 10 and 15, fuses 3 and 16, reactors 4 and 8, converter 5, capacitors 6 and 9, inverter 7, and a current transformer 11. Switch 2, fuse 3, reactor 4, converter 5, inverter 7, reactor 8, and switch 10 are connected in series in the mentioned order between AC input terminal T2 and output terminal T4.

Fuse 16 and switch 15 are connected in series in the mentioned order between the output terminal of converter 5 and battery terminal T3. Capacitor 6 is connected between the output terminal of converter 5 and a line to a reference voltage (not shown). Capacitor 9 is connected between the output terminal of reactor 8 and a line to a reference voltage.

Switch 2 is turned on (set conductive) to bring converter 5 into operation, and is turned off (set nonconductive) to stop the operation of converter 5. Fuse 3 blows in the case where an excessively large current flows from AC input terminal T2 to converter 5 so as to protect converter 5 and the like. Reactor 4 blocks any carrier frequency signal generated by converter 5 so as to prevent the carrier frequency signal from adversely affecting the AC power source.

Converter 5 converts the AC power supplied from AC power source 22 (see FIG. 1) via AC input terminal T2 to DC power.

Fuse 16 blows when an excessively large current flows between converter 5 and battery 30 (see FIG. 1) so as to protect converter 5, inverter 7, battery 30 and the like. Switch 15 is turned on at the time of charging and discharging battery 30, and is turned off at the time of replacing battery 30 or the like. Capacitor 6 smoothes the DC voltage of the DC power converted by converter 5.

Inverter 7 converts the DC power supplied from converter 5 or the DC power supplied from battery 30 to AC power. The frequency and phase of the AC power converted by inverter 7 are identical to the frequency and phase of the AC power supplied from AC power source 22. In addition, the frequency and the voltage of the AC power converted by inverter 7 are constant.

Reactor 8 and capacitor 9 constitute an output filter used to filter any carrier frequency signal generated in inverter 7 so as to prevent the carrier frequency signal from adversely affecting load 23 (see FIG. 1).

Switch 10 is turned on in the inverter power-supplying mode so as to supply the AC power converted by inverter 7 to load 23. Current transformer 11 is disposed between switch 10 and output terminal T4 so as to measure the value of a load current flowing from switch 10 to output terminal T4. Current transformer 11 detects the load current supplied to load 23 via output terminal T4, and outputs a load current value signal S11 to a fan control circuit 20 which will be described below.

At the startup of the uninterruptible power supply apparatus, firstly, switches 2 and 15 are turned on to bring converter 5 into operation so as to charge capacitor 6 and battery 30. When the charging of capacitor 6 is completed, inverter 7 is brought into operation. As the output voltage of inverter 7 becomes stable, switch 10 is turned on so as to supply AC power to load 23 in the inverter power-supplying mode.

When AC power is normally supplied from the AC power source, the AC power is converted by converter 5 to DC power. The DC power converted by converter 5 is supplied to battery 30 and inverter 7. Inverter 7 converts the DC power supplied from converter 5 to DC power having a constant voltage at a constant frequency, and supplies it to load 23.

In the case where an AC power source is out of power and thus fails to supply AC power, switch 2 is turned off to stop the operation of converter 5, the DC power stored in battery 30 is supplied to inverter 7. Inverter 7 converts the DC power supplied from battery 30 to AC power having a constant voltage at a constant frequency, and supplies it to load 23. Thus, even when a power outage occurs, as long as battery 30 stores DC power, it is possible to keep load 23 in operation. In the case where the power is restored in a short time, switch 2 is turned on again so as to bring converter 5 into operation and the uninterruptible power supply apparatus returns back to the inverter power-supplying mode.

Uninterruptible power module 1 further includes a switch 18, a cooling fan 17, and fan control circuit 20.

One terminal of switch 18 is connected to the output terminal of reactor 8. The other terminal of switch 18 is connected to cooling fan 17. Cooling fan 17 is supplied with the AC power generated at the output terminal of reactor 8 via switch 18 connected in series.

Cooling fan 17 includes a fan and an electric motor for driving the fan, and is configured to output a malfunction detection signal S17 to fan control circuit 20 if an malfunction occurs in the motor. Fan control circuit 20, on the basis of malfunction detection signal S17 output by cooling fan 17 and load current value signal S11 output by current transformer 11, generates a switch control signal S20 so as to control the on/off of switch 18 as well as an alarming buzzer (not shown).

Figure 3:
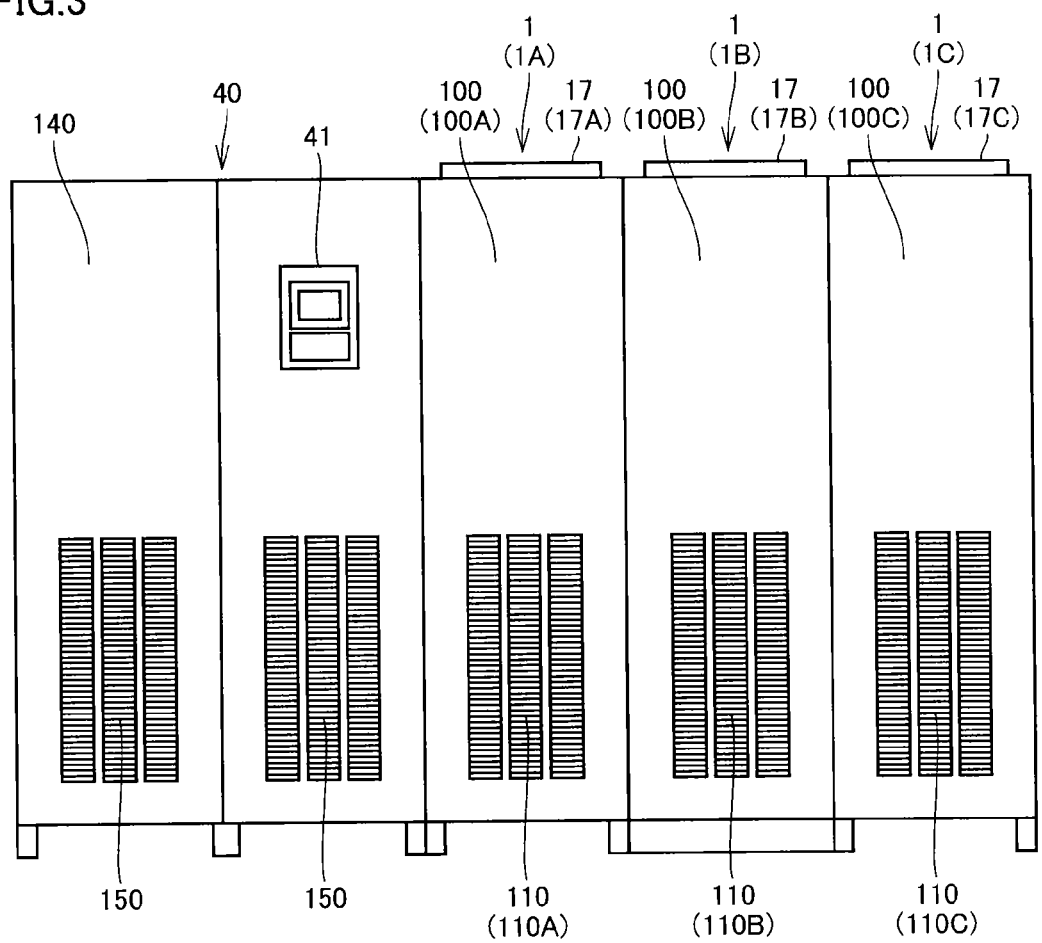
FIG. 3 is a front view of the uninterruptible power supply apparatus.
Figure 4:
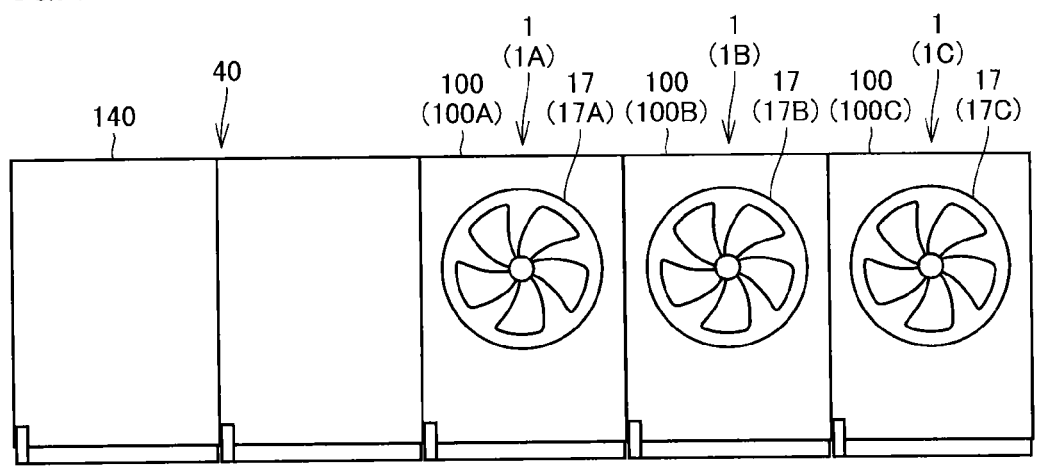
FIG. 4 is a planar view of the uninterruptible power supply apparatus.

FIG. 3 is a front view of the uninterruptible power supply apparatus, and FIG. 4 is a planar view of the uninterruptible power supply apparatus. As illustrated in FIGS. 3 and 4, the uninterruptible power supply apparatus according to the present embodiment includes a plurality of housings 100 and a plurality of housings 140. Each housing 100 houses therein uninterruptible power module 1 illustrated in FIGS. 1 and 2. Converter 5 and inverter 7 illustrated in FIGS. 1 and 2 are housed in housing 100 as well. Each housing 140 houses therein bypass circuit 40 illustrated in FIG. 1. Housing 100 and housing 140 are disposed adjacent to each other.

The uninterruptible power supply apparatus illustrated in FIGS. 3 and 4 includes three uninterruptible power modules 1A, 1B and 1C. Uninterruptible power module 1A is housed in housing 100A, uninterruptible power module 1B is housed in housing 100B, and uninterruptible power module 1C is housed in housing 100C.

Housing 100A, 100B and 100C that house uninterruptible power modules 1A, 1B and 1C, respectively, are disposed in the mentioned order. Specifically, housing 100A is disposed adjacent to housing 140 that houses bypass circuit 40 and housing 100B is disposed adjacent to housing 100A, and thus, housing 100A is disposed between housing 140 and housing 100B. Housing 100C is disposed adjacent to housing 100B, and thus, housing 100B is disposed between housing 100A and housing 100C.

Accordingly, three housings 100A, 100B and 100C, each houses therein uninterruptible power module 1, are disposed adjacent to each other with housing 100A on the left, housing 100B on the central and housing 100C on the right. One side surface of housing 100B faces housing 100A, and another side surface of housing 100B faces housing 100C.

Cooling fan 17 described in the above with reference to FIG. 2 is disposed on the ceiling of housing 100. The uninterruptible power supply apparatus is provided with a plurality of cooling fans 17, identical in number to housings 100. A cooling fan 17A is disposed on the ceiling of housing 100A. A cooling fan 17B is disposed on the ceiling of housing 100B. A cooling fan 17C is disposed on the ceiling of housing 100C.

A front surface of housing 100 is formed with an opening 110. Opening 110 communicates an internal space of housing 100 to the external environment. The rotation of cooling fan 17 allows air to flow from the front side of housing 100 into housing 100 via opening 110. In the present embodiment, housing 100A is formed with an opening 110A, housing 100B is formed with an opening 110B, and housing 100C is formed with an opening 110C.

A front surface of housing 140 is formed with an opening 150. Opening 150 communicates the internal space of housing 140 to the external environment. The front surface of housing 140 is provided with an operation panel 41 for an operator to operate the uninterruptible power supply apparatus.

Figure 5:
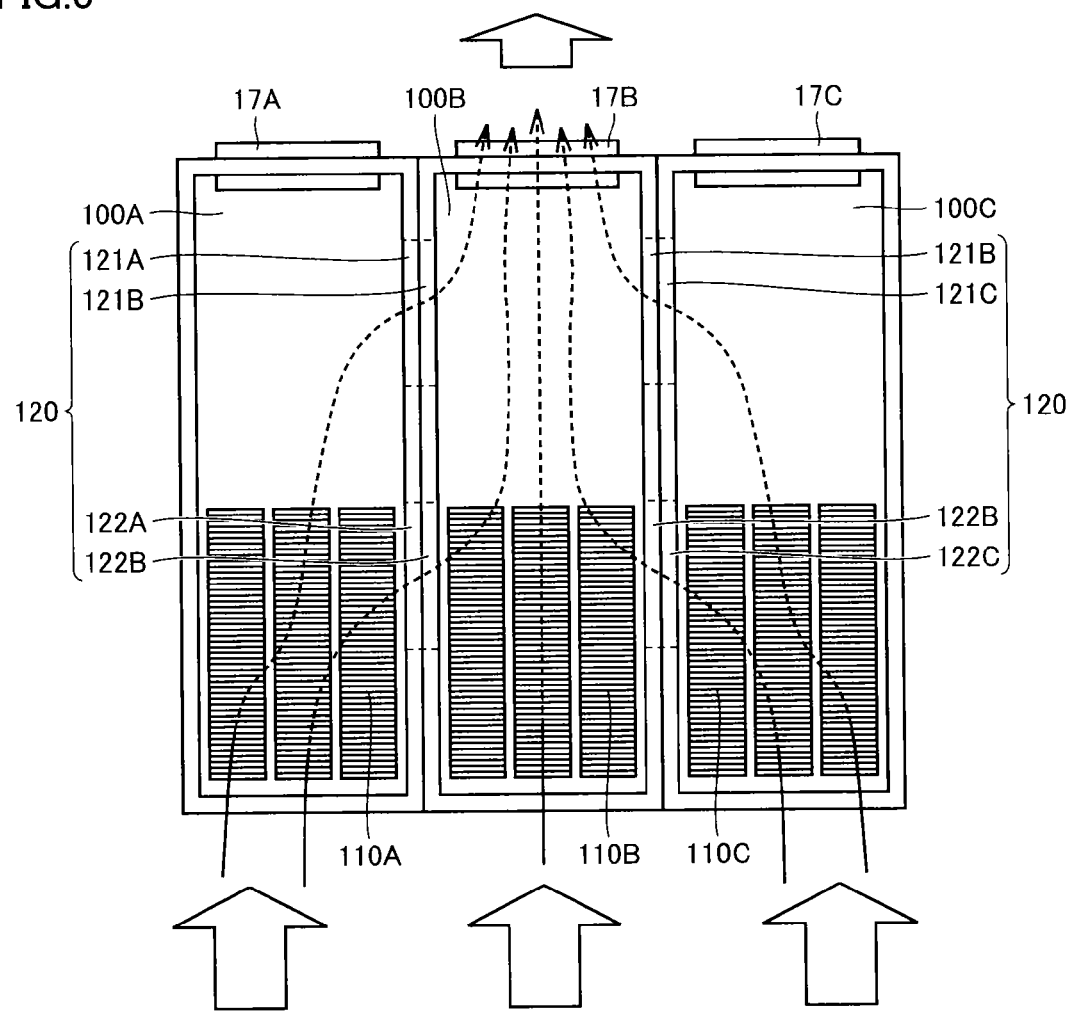
FIG. 5 is a first schematic diagram illustrating a cooling air current inside a housing of an uninterruptible power module.

FIG. 5 is a first schematic diagram illustrating a cooling air current inside housing 100 of uninterruptible power module 1. As illustrated in FIG. 5, an opening 120 is formed on a side surface of each housing 100. Opening 120 includes openings 121A and 122A formed in housing 100A, openings 121B and 122B formed in housing 100B, and openings 121C and 122C formed in housing 100C.

Opening 121A and opening 122A are formed on a side surface of housing 100A which faces housing 100B. Opening 121A is formed on the side surface of housing 100A and is located closer to the ceiling, and opening 122A is formed on the side surface of housing 100A and is located closer to the bottom surface. Thus, opening 121A is formed higher than opening 122A. In other words, opening 122A is formed lower than opening 121A.

Opening 121B and opening 122B are formed both on a side surface of housing 100B which faces housing 100A and on a side surface of housing 100B which faces housing 100C. Opening 121B is formed on the side surface of housing 100B and is located closer to the ceiling, and opening 122B is formed on the side surface of housing 100B and is located closer to the bottom. Thus, opening 121B is formed higher than opening 122B. In other words, opening 122B is formed lower than opening 121B.

Opening 121C and opening 122C are formed on a side surface of housing 100C which faces housing 100B. Opening 121C is formed on the side surface of housing 100C and is located closer to the ceiling, and opening 122C is formed on the side surface of housing 100C and is located closer to the bottom. Thus, opening 121C is formed higher than opening 122C. In other words, opening 122C is formed lower than opening 121C.

Opening 121A formed in housing 100A and opening 121B formed in housing 100B adjacent to housing 100A are formed to face each other at a position. Opening 122A formed in housing 100A and opening 122B formed in housing 100B adjacent to housing 100A are formed to face each other at a position. Thereby, the internal space of housing 100A and the internal space of housing 100B are in communication with each other through a pair of openings 121A and 121B and another pair of openings 122A and 122B.

Opening 121B formed in housing 100B and opening 121C formed in housing 100C adjacent to housing 100B are formed to face each other at a position. Opening 122B formed in housing 100B and opening 122C formed in housing 100C adjacent to housing 100B are formed to face each other at a position. Thereby, the internal space of housing 100B and the internal space of housing 100C are in communication with each other through a pair of openings 121B and 121C and another pair of openings 122B and 122C.

The activation of cooling fan 17 allows an air current to be generated in the internal space of housing 100. The air flows from one of the internal space of housing 100A and the internal space of housing 100B to the other through the pair of opening 121A and 121B and the other pair of openings 122A and 122B. Similarly, the air flows from one of the internal space of housing 100B and the internal space of housing 100C to the other through the pair of opening 121B and 121C and the other pair of openings 122B and 122C.

In the example illustrated in FIG. 5, among three cooling fans 17A, 17B and 17C, only cooling fan 17B disposed inside housing 100B is brought into operation, and cooling fan 17A disposed inside housing 100A and cooling fan 17C disposed inside housing 100C are stopped. The solid and dashed arrows and the white arrows in FIG. 5 illustrate the flowing directions of air.

As illustrated in FIG. 5, the air flows from the front side of housing 100B into housing 100B through opening 110B formed in housing 100B. The air entered inside housing 100B flows through the inner space of housing 100B, and is discharged to the external environment of housing 100B through cooling fan 17B which is disposed on the ceiling of housing 100B.

Similarly, the air flows from the front side of housing 100A into housing 100A through opening 110A formed in housing 100A. The air entered inside housing 100A flows through the internal space of housing 100A, and thereafter flows into housing 100B through the pair of openings 121A and 121B and the other pair of 122A and 122B. The air entered inside housing 100B is discharged to the external environment of housing 100B through cooling fan 17B which is disposed on the ceiling of housing 100B.

Similarly, the air flows from the front side of housing 100C into housing 100C through opening 110C formed in housing 100C. The air entered inside housing 100C flows through the internal space of housing 100C, and thereafter flows into housing 100B through the pair of openings 121C and 121B and the other pair of 122C and 122B. The air entered inside housing 100B is discharged to the external environment of housing 100B through cooling fan 17B which is disposed on the ceiling of housing 100B.

Since opening 120 is formed on the side surfaces of housing 100 and the housing 100 is made in communication with the internal space of an adjacent housing 100 through opening 120, as illustrated in FIG. 5, even in the case where only cooling fan 17B is brought into operation and the other two cooling fans 17A and 17C are stopped, it allows an air current to be generated in all of the internal spaces of housings 100A, 100B and 100C.

Figure 6:
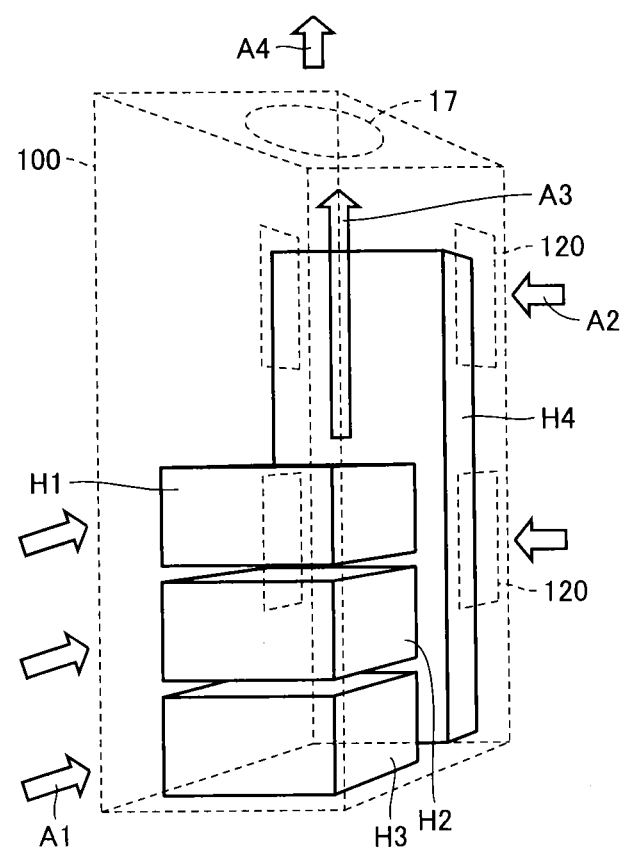
FIG. 6 is a second schematic diagram illustrating a cooling air current inside a housing of the uninterruptible power module.

FIG. 6 is a second schematic diagram illustrating a cooling air current inside housing 100 of uninterruptible power module 1. In FIG. 6, heat-generating apparatuses H1 to H4 included in uninterruptible power module 1 is schematically illustrated by rectangular boxes drawn in solid lines. Heat-generating apparatuses H1 to H4 may be, for example, reactors 4 and 8, converter 5, inverter 7 and the like (see FIG. 2) provided in uninterruptible power module 1.

In FIG. 6, housing 100, opening 120 formed on the side surface of housing 100, and cooling fan 17 disposed on the ceiling of housing 100 are illustrated schematically by broken lines.

The white arrow A1 in FIG. 6 denotes an air current flowing through opening 110 formed on the front surface of housing 100 (see FIG. 3) into housing 100. The white arrow A2 denotes an air current flowing through opening 120 formed on the side surface of housing 100 into housing 100. The white arrow A3 denotes an air current rising in the internal space of housing 100 toward the ceiling. The white arrow A4 denotes an air current discharged by cooling fan 17 out of housing 100.

As illustrated in FIG. 6, the air flowing through opening 110 into housing 100 flows through the vicinity of heat-generating apparatuses H1 to H3. Heat-generating apparatuses H1 to H3 are stacked on the bottom surface of housing 100. Opening 110 is formed at a position corresponding to the arrangement of heat-generating apparatuses H1 to H3. Thus, the heat generated by heat-generating apparatuses H1 to H3 is transmitted to the air current, and is discharged to the external environment of housing 100 through cooling fan 17.

The air flowing through opening 120 into housing 100 flows through the vicinity of heat-generating apparatus H4. Heating device H4 is disposed closer to the rear surface of housing 100. Opening 120 is formed at a position corresponding to the arrangement of heat-generating apparatus H4. Together with reference to FIG. 4, cooling fan 17 is also formed closer to the rear surface of housing 100 at a position corresponding to the arrangement of heat-generating apparatus H4. Thus, the heat generated by heat-generating apparatus H4 is transmitted to the air current, and is discharged to the external environment of housing 100 through cooling fan 17.

Thus, as cooling fan 17 is actuated, an air current is generated inside housing 100 to cool heat-generating apparatuses H1 to H4 housed in housing 100.

Figure 7:
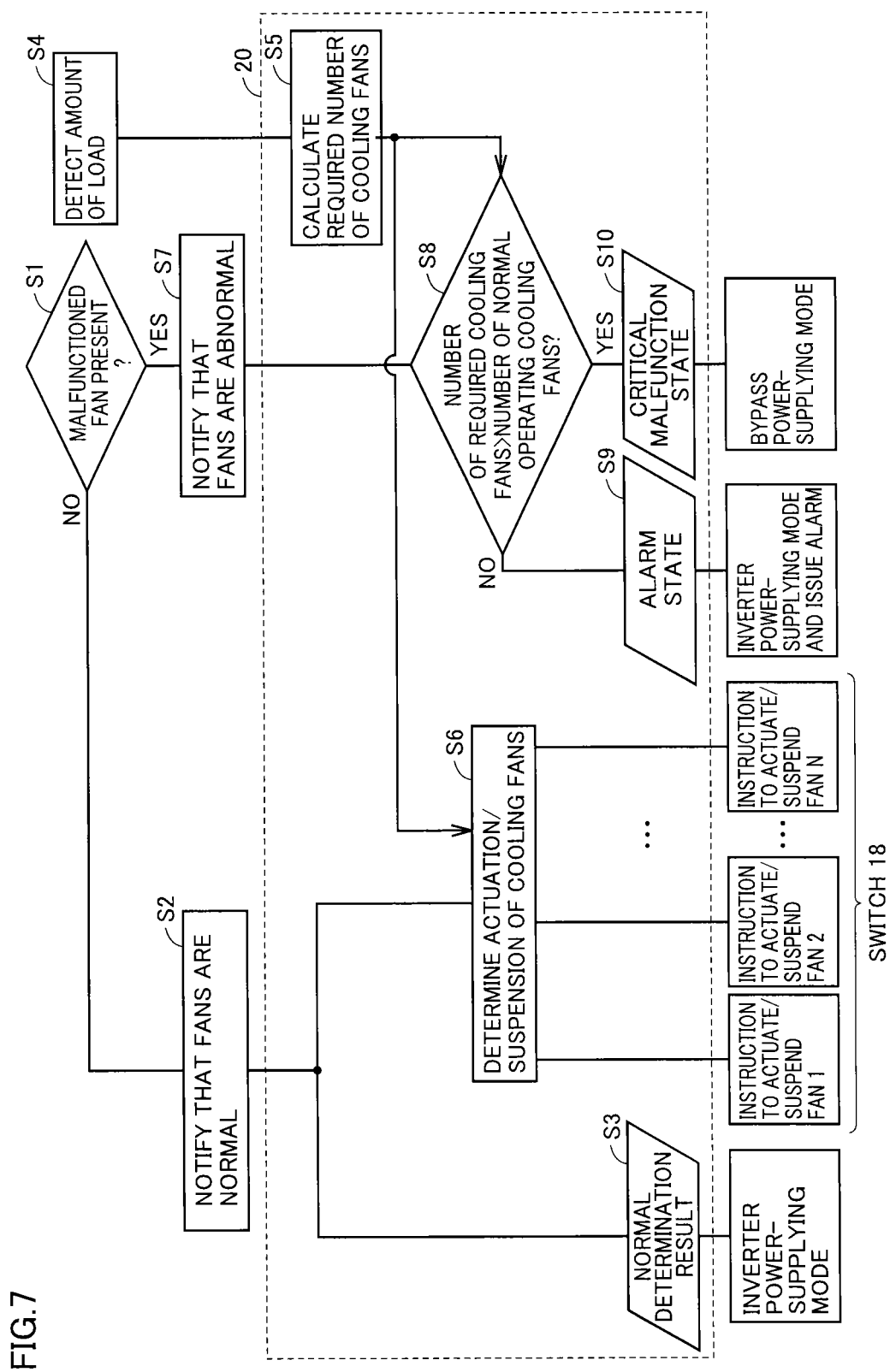
FIG. 7 is a flow chart illustrating the operations of the uninterruptible power supply apparatus.

FIG. 7 is a flow chart illustrating the operations of the uninterruptible power supply apparatus. With reference to FIG. 7 and FIG. 2 described in the above, the controls on the actuation and suspension of cooling fan 17 provided in the uninterruptible power supply apparatus will be described in detail.

First, at step S1, whether or not a malfunctioned cooling fan 17 is present in the plurality of cooling fans 17 is determined.

In the case where no malfunctioned cooling fan is present in the plurality of cooling fans 17 (NO at step S1), the process proceeds to step S2 where it is notified that cooling fans 17 are in a normal state with no malfunction. Thus, a signal indicating that all of cooling fans 17 are working normally is sent from each cooling fan 17 illustrated in FIG. 2 to fan control circuit 20.

Then, at step S3, fan control circuit 20 determines that the cooling function of cooling fans 17 is in a normal state, and the determination result that the cooling function of cooling fans 17 is in a normal state is output from fan control circuit 20 to a main control circuit (not shown). The main control circuit receives the normal determination result, and issues a signal instructing the uninterruptible power supply apparatus to operate in the inverter power-supplying mode to each of the switches.

Meanwhile, the amount of load is detected at step S4. Current transformer 11 illustrated in FIG. 2 detects a load current supplied to load 23, and issues load current value signal S11 to fan control circuit 20.

Next at step S5, fan control circuit 20, on the basis of load current value signal S11, calculates the required number of cooling fans 17. Specifically, fan control circuit 20, on the basis of load current value signal S11 issued from each current transformer 11 disposed in each plurality of uninterruptible power module 1, calculates the total load current value of the uninterruptible power supply apparatus by adding up the load current value of each uninterruptible power module 1.

The internal temperature of housing 100 is dependent on the value of a load current to load 23. In the case where the load current value is sufficiently smaller than the rated value, it is preferable that the number of cooling fans 17 required to be actuated so as to maintain the internal temperature of housing 100 within an allowable temperature range is less than the case where the load current value is equal to the maximum rated value. Fan control circuit 20, on the basis of the total load current value of the uninterruptible power supply apparatus, calculates the number of cooling fans 17 required to be actuated in order to properly maintain the internal temperature of housing 100. The required number of cooling fans 17 is set in such a manner that as the load current is at the maximum rated value, the total number of cooling fans 17 is required to be actuated, and the required number of cooling fans 17 becomes less as the load current decreases.

Subsequently at step S6, fan control circuit 20, on the basis of the calculated number of required cooling fans 17, determines the actuation and suspension of cooling fans 17. Fan control circuit 20 determines which cooling fan 17 should be actuated or suspended so as to keep the number of cooling fans 17 to be actuated equal to the required number of cooling fans 17.

Fan control circuit 20 issues a switch control signal S20 configured to switch on switch 18 to switch 18 which corresponds to cooling fan 17 to be actuated. Meanwhile, fan control circuit 20 issues a switch control signal S20 configured to switch off switch 18 to switch 18 which corresponds to cooling fan 17 to be suspended.

Thus, the actuation and suspension of each cooling fan 17 is controlled on the basis of the total load current supplied by the plurality of uninterruptible power modules 1 to load 23. As long as the required number of cooling fans 17 is brought into operation, the cooling capability of the internal side of housing 100 in uninterruptible power module 1 is ensured optimum.

In the determination at step S1, in the case where a malfunctioned cooling fan 17 is present in the plurality of cooling fans 17 (YES at step S1), the process proceeds to step S7 where it is notified that one cooling fan 17 is in an abnormal state. Thus, malfunction detection signal S17 indicating that cooling fan 17 illustrated in FIG. 2 is malfunctioned is input sent from the same cooling fan 17 to fan control circuit 20. The other normal (non-malfunctioned) cooling fans 17 each sends a signal indicating that the same cooling fan 17 is normal to fan control circuit 20.

After receiving malfunction detection signal S17, fan control circuit 20, in the next step S8, compares the required number of cooling fan 17, which is calculated at step S5, with the number of cooling fans 17 determined to be normal (non-malfunctioned) on the basis of malfunction detection signal S17.

In the case where the number of normal cooling fans 17 is not less than the number required cooling fans 17 (NO in the comparison of step S8), fan control circuit 20, at step S9, determines that the cooling function of cooling fans 17 is in an alarm state. The alarm state refers to such a state that although some of the plurality of cooling fans 17 are malfunctioned, the cooling capacity required by uninterruptible power modules 1 can be achieved by actuating a proper number of operable cooling fans 17.

The determination result denoting that the cooling function of cooling fans 17 is in the alarm state is issued from fan control circuit 20 to the main control circuit (not shown). The main control circuit, after receiving the determination result about the alarm state, operates the uninterruptible power supply apparatus in the inverter power-supplying mode, and issues an alarm signal to inform the operator.

The alarm signal may be an alarm sound sent by an alarm buzzer or may be any changes in visual effects such as the lightening of an warning lamp or the display of messages. In addition, the alarm buzzer and the warning lamp may be used in combination.

At step S8, in the case where it is determined that the required number of cooling fans 17 is greater than the number of normal cooling fans 17 (YES in the comparison of step S8), fan control circuit 20, at step S10, determines that the cooling function of cooling fan 17 is in a critical malfunction state. The critical malfunction state refers to such a state that the cooling capacity required by uninterruptible power modules 1 cannot be achieved even though the total number of operable cooling fans 17 is actuated.

The determination result denoting that the cooling function of cooling fan 17 is in a critical malfunction state is issued from fan control circuit 20 to the main control circuit (not shown). The main control circuit, after receiving the determination result about the critical malfunction state, issues a signal instructing the uninterruptible power supply apparatus to operate in the bypass power-supplying mode to each of the switches.

FIG. 8 is a table illustrating the relationship of the number of operating cooling fans to the required number of cooling fans and the malfunctioned number of cooling fans. In the example illustrated in FIG. 8, the uninterruptible power supply apparatus is provided with four uninterruptible power modules 1, and thus it includes four cooling fans 17.

As illustrated in FIG. 8, if the malfunctioned number of cooling fan 17 is 0, the required number of cooling fans 17 calculated on the basis of the total load current value of the uninterruptible power supply apparatus is actuated.

If the malfunctioned number of cooling fan 17 is one, in the case where the required number of cooling fan 17 is three or less, the uninterruptible power supply apparatus actuates the required number of cooling fans 17 and meanwhile issues an alarm. In the case where the required number of cooling fan 17 is four, the uninterruptible power supply apparatus is switched to the bypass power-supplying mode.

If the malfunctioned number of cooling fan 17 is two, in the case where the required number of cooling fan 17 is two or less, the uninterruptible power supply apparatus actuates the required number of cooling fans 17 and meanwhile issues an alarm. In the case where the required number of cooling fan 17 is three or more, the uninterruptible power supply apparatus is switched to the bypass power-supplying mode.

If the malfunctioned number of cooling fan 17 is three, in the case where the required number of cooling fan 17 is one, the uninterruptible power supply apparatus actuates the required number of cooling fans 17 and meanwhile issues an alarm. In the case where the required number of cooling fan 17 is two or more, the uninterruptible power supply apparatus is switched to the bypass power-supplying mode.

If the malfunctioned number of cooling fan 17 is four, that is to say that all of the cooling fans 17 are malfunctioning, regardless of the required number of cooling fans 17, the uninterruptible power supply apparatus is switched to the bypass power-supplying mode.

Hereinafter, the effects of the present embodiment will be described.

According to the uninterruptible power supply apparatus of the present embodiment, as illustrated in FIG. 5, housing 100 which houses therein converter 5 and inverter 7 of uninterruptible power module 1 is provided with cooling fan 17 configured to cool the internal space of housing 100. Housing 100 is formed with opening 120. Opening 120 formed in housing 100 and another opening 120 formed in adjacent housing 100 of another uninterruptible power module 1 are facing each other. As illustrated in FIGS. 2 and 7, the uninterruptible power supply apparatus further includes fan control circuit 20 configured to control cooling fan 17. As illustrated in FIG. 7, fan control circuit 20, on the basis of the total amount of load of the plurality of uninterruptible power modules 1, controls the actuation and suspension of cooling fans 17.

The cooling fans in the uninterruptible power supply apparatus each is set to have a sufficient cooling capacity at a condition that each uninterruptible power module is operating under a maximum rated load. In the case where a conventional uninterruptible power supply apparatus is operating at a smaller load, if the cooling fans of each uninterruptible power module are brought into operation at the rated cooling capacity, there occurs such a problem that the cooling capacity would be excessively large relative to the amount of heat generated.

In contrast, in the uninterruptible power supply apparatus according to the present embodiment, among the plurality of cooling fans 17, the operating number of cooling fans 17 is controlled on the basis of the total load of the plurality of uninterruptible power modules 1. The cooling capacity of each cooling fan can be properly adjusted in response to the amount of heat generated by the uninterruptible power supply apparatus so as to optimize the number of operating cooling fans 17, which makes it possible to stop the unnecessary cooling fans 17. Therefore, it is possible to reduce the cost of operation of cooling fan 17, and it is also possible to reduce the noise generated along with the operation of cooling fan 17.

Since only the required number cooling fans 17 is used, when there is no need to bring the total number of cooling fans 17 into operation, by appropriately switching the actuation and suspension of the plurality of cooling fans 17, it is possible to make cooling fans 17 operate with good balance. Thus, it is possible to enable each cooling fan 17 a longer operation life, and it is possible to improve the reliability of the uninterruptible power supply apparatus.

Since housing 100 is formed with opening 120, the air is allowed to flow across the adjacent housings 100, and thus, even though one cooling fan 17 for cooling uninterruptible power module 1 stops working, uninterruptible power module 1 can be reliably cooled by the air current which is generated by the other operating cooling fans 17. Therefore, even in the case where the number of operating cooling fans 17 is reduced, it is still possible to ensure the cooling of all uninterruptible power modules 1.

Further, as illustrated in FIG. 7, fan control circuit 20, on the basis of the malfunctioned number of cooling fans 17 and the total load of the plurality of uninterruptible power modules 1, controls the actuation and suspension of cooling fans 17. Even though a malfunctioned cooling fan 17 is present, if the required cooling capacity can be provided by normally operating cooling fans 17, the operation of uninterruptible power module 1 is continued without being switched to the bypass power-supplying mode. By making cooling fans 17 redundant in number in this way, it is possible for the uninterruptible power supply apparatus to sufficiently exhibit the instantaneous power outage protection function, which makes it possible to improve the reliability of power supply by the uninterruptible power supply apparatus.

Furthermore, as illustrated in FIG. 7, in the case where the required number of operating cooling fans 17 set on the basis of the total load of the plurality of uninterruptible power modules 1 exceeds the number of normally operating cooling fans 17, the operation of uninterruptible power module 1 is switched to bypass circuit 40. Accordingly, it is possible to suppress any damage to the uninterruptible power supply apparatus, and it is also possible to continue the uninterruptible power supply to load 23 via bypass circuit 40.

Furthermore, as illustrated in FIG. 7, in the case where the required number of operating cooling fans 17 set on the basis of the total load of the plurality of uninterruptible power modules 1 is not more than the number of normally operating cooling fans 17, an alarm is issued and the operation is continued. Thus, even though some of cooling fans 17 are malfunctioned, it is still possible for the uninterruptible power supply apparatus to sufficiently exhibit the instantaneous power outage protection function, and meanwhile, the issue of the alarm makes the operator aware of the malfunction of cooling fans 17.

Although the present invention has been described and illustrated in detail, it is clearly understood that the same is by way of illustration and example only and is not to be taken by way of limitation, the scope of the present invention being interpreted by the terms of the appended claims.

What is claimed is:

1. An uninterruptible power supply apparatus provided with a plurality of uninterruptible power modules connected in parallel between an AC power source and a load, and a bypass circuit, said uninterruptible power modules each including:
a converter for converting AC power supplied from said AC power source into DC power;
a power storage device for storing the DC power converted by said converter;
an inverter for converting DC power supplied from said converter or said power storage device into AC power;
a housing for housing said converter and said inverter;
a cooling fan for cooling the interior of said housing; said housing being formed with an opening, and said opening and an opening formed in an adjacent housing for housing another uninterruptible power module being configured to face each other, and
a fan control circuit for controlling said cooling fan, said fan control circuit being configured to control the actuation and suspension of said cooling fan on the basis of a total load of said plurality of uninterruptible power modules.

2. The uninterruptible power supply apparatus according to claim 1, wherein
said fan control circuit detects a malfunctioned cooling fan of said cooling fans, and
said fan control circuit controls the actuation and suspension of said cooling fans on the basis of the malfunctioned number of said cooling fans and the total load of said plurality of uninterruptible power modules.

3. The uninterruptible power supply apparatus according to claim 2, wherein said uninterruptible power supply apparatus switches to a bypass circuit when the number of said cooling fans required to be actuated, which is determined on the basis of the total load of said plurality of uninterruptible power modules, exceeds the number of said cooling fans operating normally.

4. The uninterruptible power supply apparatus according to claim 2, wherein
said uninterruptible power supply apparatus issues an alarm and continues the operation when the number of said cooling fans required to be actuated, which is determined on the basis of the total load of said plurality of uninterruptible power modules, is equal to or less than the number of said cooling fans operating normally.

5. The uninterruptible power supply apparatus according to claim 3, wherein
said uninterruptible power supply apparatus issues an alarm and continues the operation when the number of said cooling fans required to be actuated, which is determined on the basis of the total load of said plurality of uninterruptible power modules, is equal to or less than the number of said cooling fans operating normally.

\* \* \* \* \*